US008954898B2

(12) United States Patent
Inoue et al.

(10) Patent No.: US 8,954,898 B2
(45) Date of Patent: Feb. 10, 2015

(54) SOURCE-MASK OPTIMIZATION FOR A LITHOGRAPHY PROCESS

(71) Applicant: International Business Machines Corporation, Armonk, NY (US)

(72) Inventors: Tadanobu Inoue, Kanagawa (JP); David O. Melville, New York, NY (US); Alan E. Rosenbluth, Yorktown Heights, NY (US); Masaharu Sakamoto, Kanagawa (JP); Kehan Tian, Poughkeepsie, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 13/836,327

(22) Filed: Mar. 15, 2013

(65) Prior Publication Data

US 2014/0282291 A1     Sep. 18, 2014

(51) Int. Cl.
*G06F 17/50* (2006.01)
(52) U.S. Cl.
CPC .................... *G06F 17/5081* (2013.01)
USPC .......................................................... 716/52
(58) Field of Classification Search
CPC .................... G03F 7/705; G03F 7/70125
USPC ............................................. 716/100, 55, 52
See application file for complete search history.

(56) References Cited

U.S. PATENT DOCUMENTS

| 7,057,709 | B2 | 6/2006 | Rosenbluth |
| 7,363,611 | B2 | 4/2008 | Rosenbluth |
| 7,440,083 | B2 | 10/2008 | Rosenbluth |
| 7,712,071 | B2 | 5/2010 | Rosenbluth |
| 7,944,545 | B2 | 5/2011 | Bagheri et al. |
| 7,969,554 | B2 | 6/2011 | Melville et al. |
| 8,028,254 | B2 | 9/2011 | Inoue et al. |
| 8,056,023 | B2 | 11/2011 | Inoue et al. |
| 8,056,026 | B2 | 11/2011 | Inoue et al. |
| 8,108,802 | B2 | 1/2012 | Rosenbluth et al. |
| 8,490,034 | B1* | 7/2013 | Torunoglu et al. ............. 716/55 |
| 8,811,714 | B2* | 8/2014 | Gyoda et al. .................. 382/144 |
| 2003/0219095 | A1 | 11/2003 | Watanabe et al. |
| 2004/0265707 | A1 | 12/2004 | Socha |

(Continued)

OTHER PUBLICATIONS

Rosenbluth, A., et al. "Optimum Mask and Source Patterns to Print a Given Shape" Journal of Micro/Nanolithography, MEMS, and MOEMS, vol. 1. No. 1. Apr. 2002. pp. 13-30.

(Continued)

*Primary Examiner* — Suchin Parihar
(74) *Attorney, Agent, or Firm* — Tutunjian & Bitetto, P.C.; Vazken Alexanian

(57) ABSTRACT

Systems and methods for optimizing a source shape and a mask shape for a lithography process are disclosed. One such method includes performing a mask optimization for the lithography process in accordance with a set of parameters including at least one variable representation, at least one objective and problem constraints. Further, a light source optimization for the lithography process is performed in accordance with the set of parameters. In addition, a joint light source-mask optimization is performed in accordance with the set of parameters. The method further includes iterating at least one of the mask optimization or the light source optimization by changing at least one of the variable representation, the objective or the problem constraints to maximize a common process window for the lithography process.

16 Claims, 8 Drawing Sheets

(56) References Cited

U.S. PATENT DOCUMENTS

| | | |
|---|---|---|
| 2011/0014552 A1 | 1/2011 | Hsu et al. |
| 2011/0096313 A1* | 4/2011 | Bagheri et al. ............... 355/67 |
| 2011/0219342 A1 | 9/2011 | Socha |
| 2011/0231803 A1 | 9/2011 | Inoue et al. |
| 2012/0051622 A1* | 3/2012 | Gyoda et al. ............... 382/144 |
| 2012/0077130 A1 | 3/2012 | Bagheri et al. |
| 2012/0113404 A1 | 5/2012 | Hsu et al. |
| 2012/0196210 A1 | 8/2012 | Inoue et al. |
| 2013/0036390 A1* | 2/2013 | Torres Robles et al. ........ 716/54 |
| 2013/0263063 A1* | 10/2013 | Inoue et al. ............... 716/54 |
| 2014/0282291 A1* | 9/2014 | Inoue et al. ............... 716/52 |

OTHER PUBLICATIONS

Rosenbluth, A., et al. "Global Optimization of the Illumination Distribution to Maximize Integrated Process Window" SPIE Proceedings, vol. 6154. Apr. 2006. (12 Pages).

Rosenbluth, A., et al. "Intensive Optimization of Masks and Sources for 22NM Lithography" SPIE Proceedings, vol. 7274. Mar. 2009. (15 Pages).

* cited by examiner

SOURCE-MASK OPTIMIZATION FOR A LITHOGRAPHY PROCESS

BACKGROUND

1. Technical Field

The present invention relates to lithography processes, and, more particularly, to source-mask optimization methods and systems.

2. Description of the Related Art

Throughout the past 30 years, lithography techniques and capabilities have improved to meet the demand for scaled down devices and corresponding features. For example, the minimum pitch between apertures for a mask has generally reduced about 10% per year. Here, the minimum pitch can be defined as $$\text{min pitch} = \frac{2k_1 \lambda}{NA},$$

where $k_1$ is a lithographic process complexity factor, $\lambda$ is the wavelength of the light emitted by the light source, and NA is the numerical aperture of the system. Historically, the minimum pitch has been reduced through optical scaling of $$\frac{\lambda}{NA}.$$

For the 22 nm node, the next value of $\lambda$ that should be used in optical scaling to obtain the minimum pitch accommodating the 22 nm node is approximately 13.5 nm, in the EUV wavelength scale, which is difficult fairly to implement using existing technology.

SUMMARY

Embodiments described herein below can be employed to address the problems associated with scaling down lithography processes to the 22 nm node and beyond. One embodiment of the present principles is directed to a method for optimizing a source shape and a mask shape for a lithography process. The method includes performing a mask optimization for the lithography process in accordance with a set of parameters including at least one variable representation, at least one objective and problem constraints. Further, a light source optimization for the lithography process is performed in accordance with the set of parameters. In addition, a joint light source-mask optimization is performed in accordance with the set of parameters. The method further includes iterating at least one of the mask optimization or the light source optimization by changing at least one of the variable representation, the objective or the problem constraints to maximize a common process window for the lithography process.

Another embodiment is also directed to a method for optimizing a source shape and a mask shape for a lithography process. Here, a frequency domain optimization is performed for the source shape and the mask shape by employing mask blank constraints. A spatial domain optimization for the source shape and the mask shape is performed based on the frequency domain optimization by employing a polygon-domain representation. Further, the spatial domain optimization is iterated to remove fragments of the polygon-domain representation deemed to have low optical effect.

Another embodiment is directed to a system for optimizing a source shape and a mask shape for a lithography process. The system includes a mask optimization module, a source optimization module, a joint source-mask optimization module and a controller. The mask optimization module is configured to perform a mask optimization for the lithography process in accordance with a set of parameters including at least one variable representation, at least one objective and problem constraints. In addition, the source optimization module is configured to perform a light source optimization for the lithography process in accordance with the set of parameters. Further, the joint source-mask optimization module is configured to perform a joint light source-mask optimization in accordance with the set of parameters. Moreover, the controller is configured to direct at least one of the mask optimization module or the source optimization module to iterate at least one of the mask optimization or the light source optimization by changing at least one of the variable representation, the objective or the problem constraints to maximize a common process window for the lithography process.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
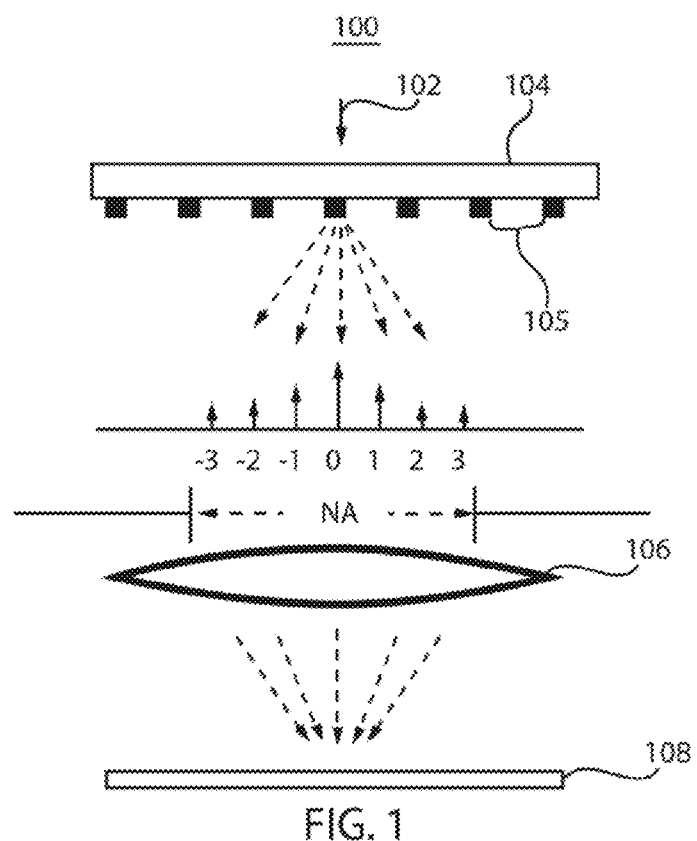
FIG. 1 is a block diagram of a lithography system illustrating the effects of a given aperture spacing in the mask of the system.
Figure 2:
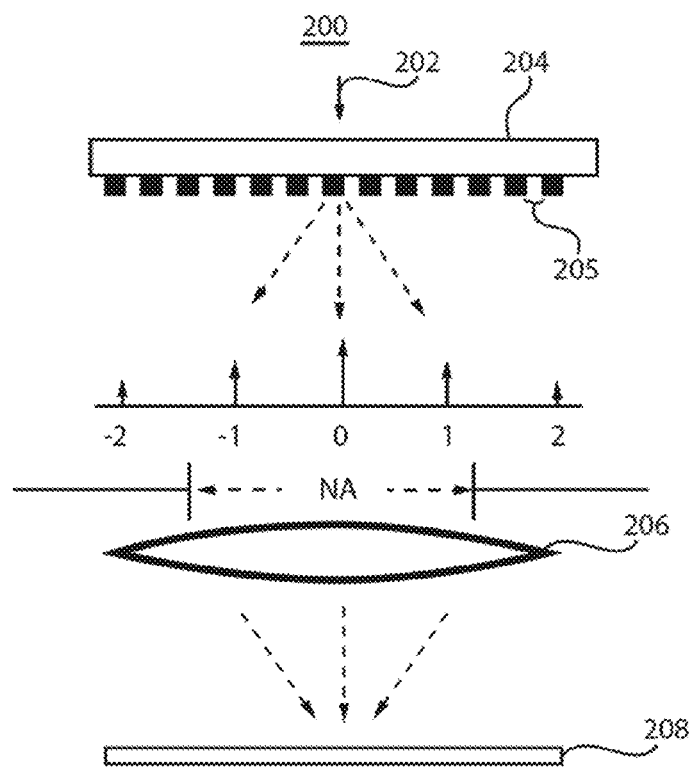
FIG. 2 is a block diagram of a lithography system illustrating the effects of an aperture spacing in the mask of the system that is narrower than the aperture spacing illustrated in FIG. 1.
Figure 3:
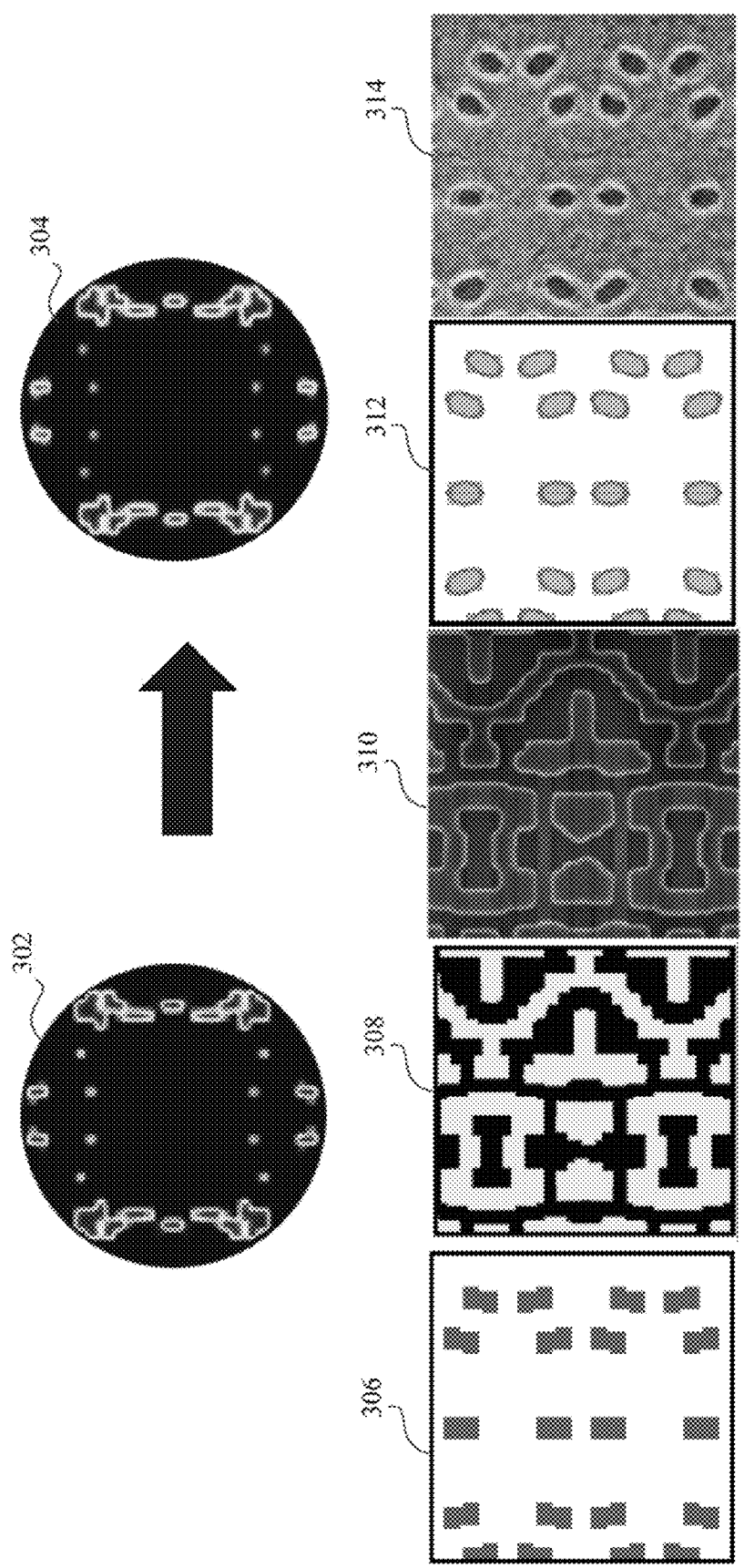
FIG. 3 illustrates various source and mask shapes and corresponding images produced with the source and mask for a 22 nm node.

Obtaining the minimum pitch accommodating the 22 nm and beyond is difficult to achieve through optical scaling alone. For example, with reference to the drawings in which like numerals represent the same or similar elements and initially to FIGS. 1 and 2, lithography systems 100 and 200 are respectively illustrated. Each respective system 100 and 200 has a light input 102 and 202 having corresponding wavelengths, a mask 104 and 204 and a lens 106 and 206 to implement a lithography process on a respective wafer 108 and 208. The two systems are essentially the same except that the aperture pitch 205 of the mask 204 is narrower than the aperture pitch 105 of the mask 104. As illustrated in FIG. 2, as the aperture pitch is reduced, many diffraction rays will be directed passed the outer edges of the lens, resulting in blurring of images generated on the wafer. FIG. 3 illustrates the difficulty in generating images for a 22 nm node. For example, FIG. 3 includes images of a source design 302, an actual measured source 304, a design layout 306 to be implemented on a wafer, a mask design 308, an actual mask 310, a simulation image 312 of the design layout 306 and an actual image 314 generated on a wafer. FIG. 3 shows a typical example of a source-mask optimization (SMO) output, including a source shape 302, a mask shape 308 and the simulation result 312. The source shape is well realizable by using a programmable illuminator as shown in image 304. Further, the mask shape can be manufactured as shown in image 310. The wafer image 314 generated from the mask 310 and the source 302 shapes is close to the simulation result 312.

Figure 4:
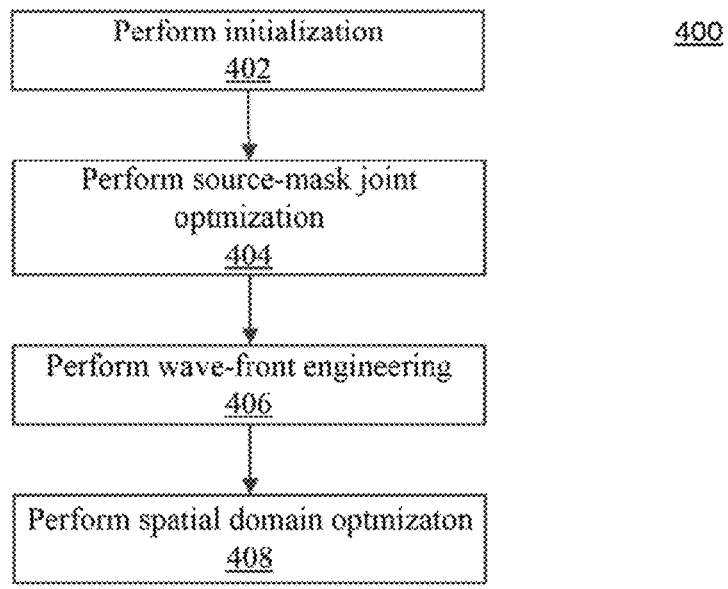
FIG. 4 is a high-level block/flow diagram of a known source-mask optimization method.

One alternative means for addressing the minimum pitch needed for the 22 nm node is the reduction of $k_1$, the lithographic process complexity factor, through appropriate design of the source and mask. For example, source-mask optimization (SMO) can be employed to extend the use of 193 water immersion lithography to the 22 nm technology node and beyond. An SMO technique is needed to simultaneously optimize the source shape and the mask shape so that they satisfy many lithographical criterions, such as, for example, constraints on dimension error, contrast, mask error enhancement factor (MEEF), lithographic process window, and so on. The SMO is classified as a constrained nonlinear optimization problem. However, SMO is generally too complicated to formularize as a single optimization problem. Thus, standard optimization methods are difficult for users to employ directly. A known method can be utilized to carry out global searches in the nonconvex problem space and thereby identify optimal solutions with fundamentally strong lithographic quality. However, the simplified formulation employed can only include the most basic elements of the ultimate set of constraints using an idealized variable representation, namely frequency domain representation. FIG. 4 illustrates an example of such a method. In accordance with the method 400 of FIG. 4, initialization is performed at step 402, a source-mask joint optimization is performed at step 404, wavefront engineering is performed at step 406, and a spatial domain optimization is performed at step 408. In the initialization step 402, an initial source shape and an initial mask shape are specified by the user. The mask optimization step 404 actually defines the mask indirectly, in terms of an optimal Fourier solution. The source-mask optimization is formulated as a constrained non-linear optimization. It optimizes a source shape and frequency domain mask so that the process window is maximized under several lithographic constraints, such as source pupil fill constraint, mask blank constraint, and so on. The frequency domain mask is converted to a manufacturable (spatial domain) mask shape by using a flow of constrained linear programming and constrained non-linear programming at step 406. Further, the mask shape and the corresponding source shape are fine-tuned at step 408. Thus, at step 408, a spatial domain joint optimization is performed as a constrained non-linear optimization with various constraints, such as a pupil fill constraint, MEEF constraint, etc.

A popular known approach is to use a joint source mask optimization (JO) without any flow. In using joint optimization without any flow, the burden is on the user to provide a reasonably good starting solution. However, it is difficult to obtain a feasible starting design by the user since there is almost no correlation between a target print pattern and mask/source shape. To employ the method, the user often has to resort to trial and error adjustment of various ad hoc weights in the objective that balance out different requirements, and/or the user may have to adjust other kinds of parametric elements repeatedly to obtain a good outcome. Infeasible starting points often cause slow convergence or non-convergence in the constrained nonlinear optimization, which poses a significant problem in the design of the source and mask.

In contrast to these known methods, exemplary embodiments of the present principles can be fully automated and can minimize manual intervention by a user. In particular, embodiments of the present principles change the variable representation, objective and/or constraints of the problem in stages. Here, multiple and repeated optimizations can be performed where each stage of optimization alters a set of constraints and/or variables by incorporation of additional constraints, changing the variable representation and/or by tightening convergence toward final specifications, among other adaptations. Thus, the optimization evolves towards solving particular lithographical criterions, thereby obviating a need to provide a relatively accurate initial design.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing. Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks. The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Figure 5:
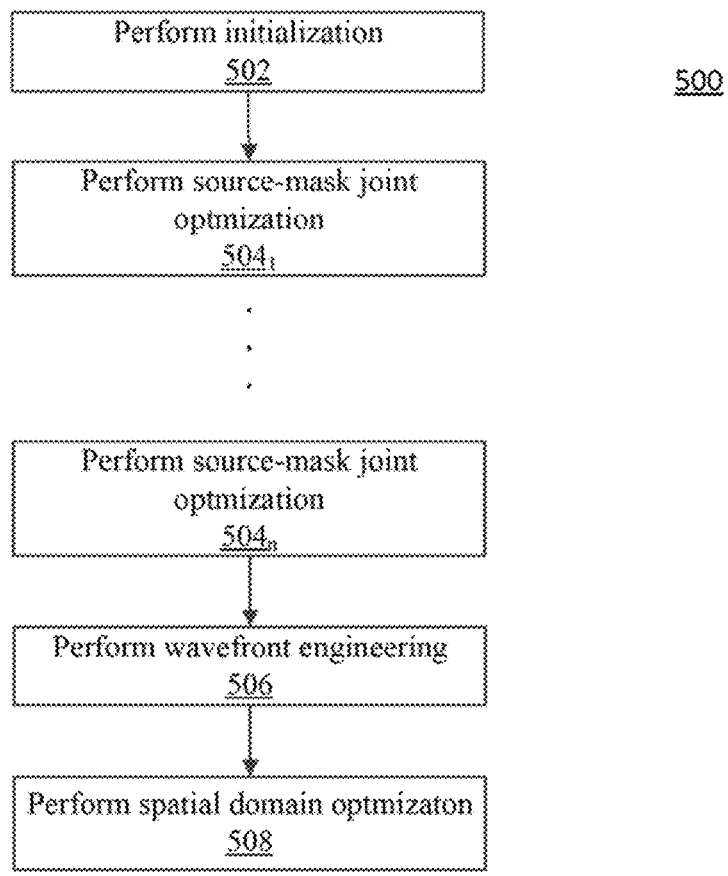
FIG. 5 is a high-level block/flow diagram of a method for optimizing a source shape and a mask shape for a lithography process in accordance with an exemplary embodiment.
Figure 6:
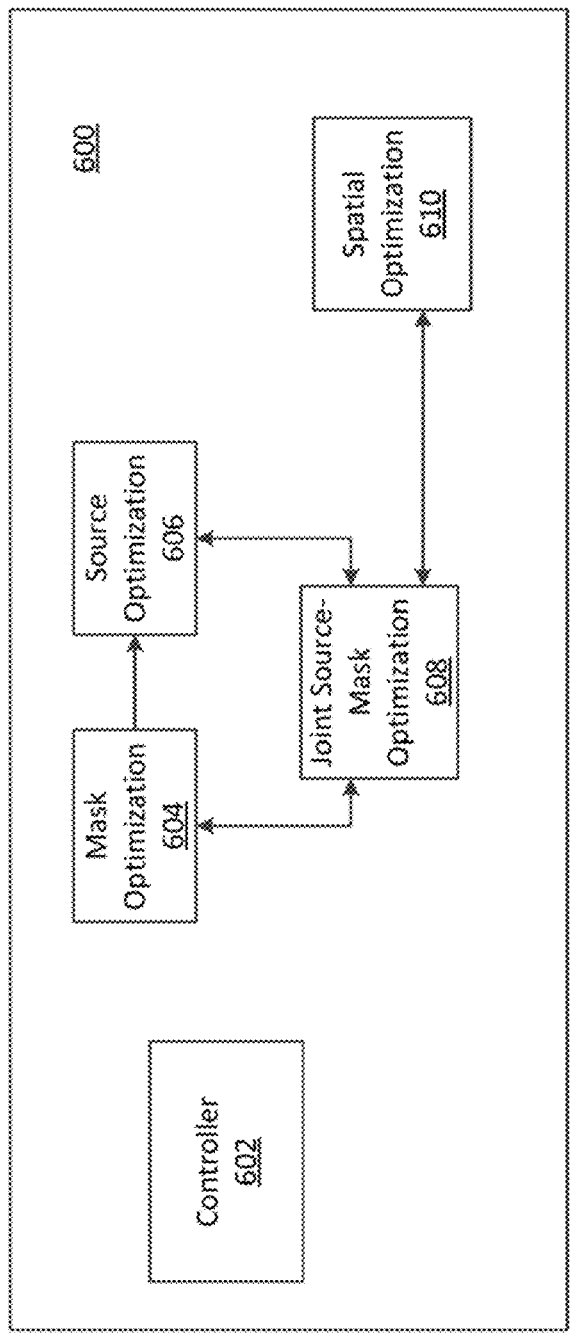
FIG. 6 is a high-level block/flow diagram of a system for optimizing a source shape and a mask shape for a lithography process in accordance with an exemplary embodiment.
Figure 7:
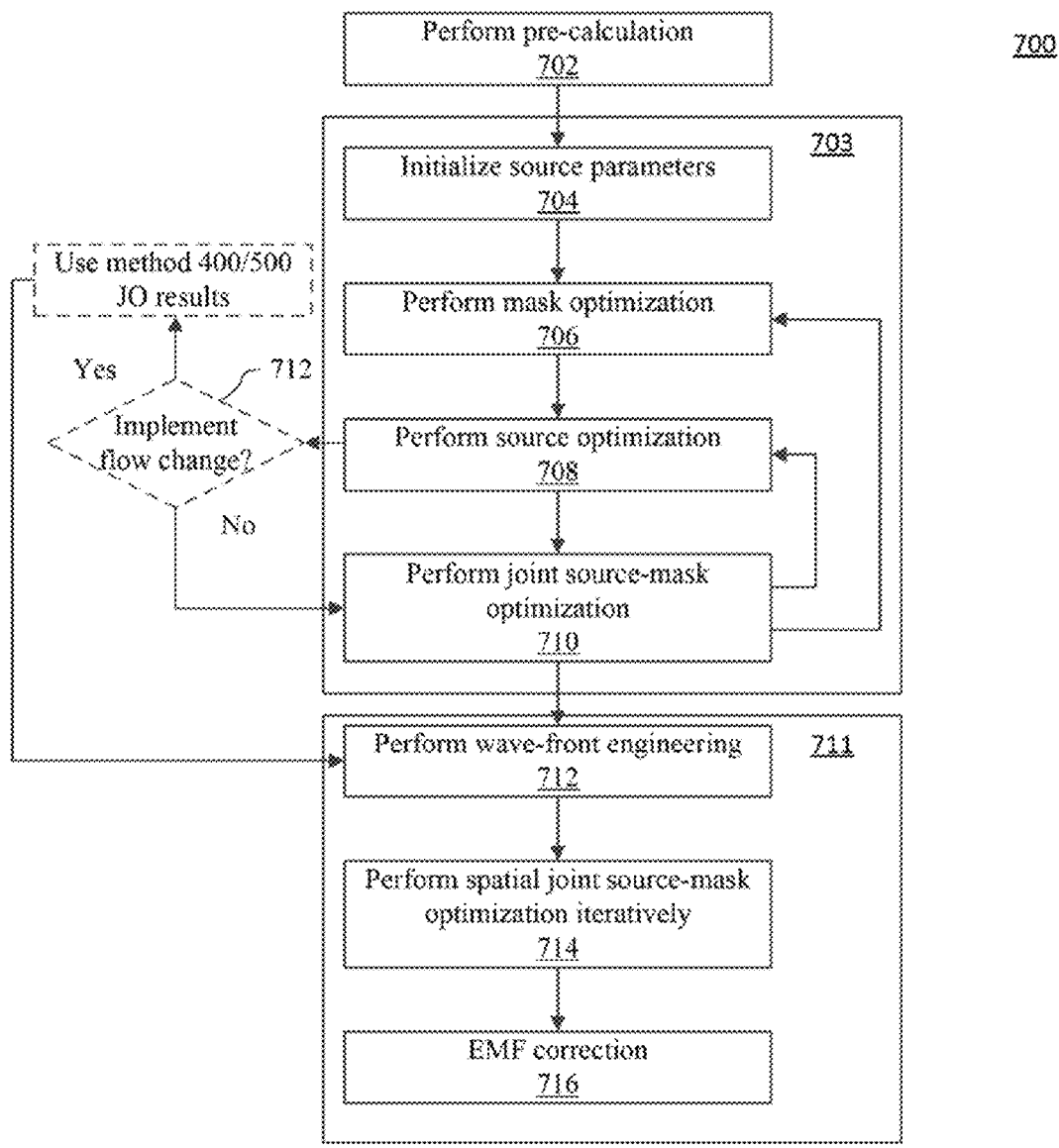
FIG. 7 is a high-level block/flow diagram of a more sophisticated method for optimizing a source shape and a mask shape for a lithography process in accordance with an exemplary preferred embodiment.

Referring again to the drawings, FIGS. 6 and 7 respectively illustrate a system 600 and a method 700 for optimizing a source shape and mask shape for a lithography process in accordance with exemplary embodiments of the present principles. The system 600 can include a controller 602, a mask optimization module 604, a source optimization module 606, a joint source-mask optimization module 608 and a spatial optimization module 610. The functions of the various elements of the system 600 are described in more detail herein below with reference to the method 700. As indicated above, the flow implemented by the system 600 and the method 700 directs the evolution of a lithographic design problem between successive optimization formulations by changing one or more variable representations, one or more objectives, and/or problem constraints in stages in a way that minimizes a disruptive departure of each formulation from its predecessor. FIG. 5 illustrates a particularly simple example of such a method. In accordance with the method 500 of FIG. 5, initialization is performed at step 502, a plurality of source-mask joint optimization steps $504_1$-$504_n$ are performed, wavefront engineering is performed at step 506, and a spatial domain optimization is performed at step 508. Steps 502, 506 and 508 of the method 500 are essentially the same as steps 402, 406 and 408 of the method 400. However, in this case, the frequency domain source-mask joint optimization of steps $504_1$-$504_n$ is repeatedly performed with relaxing constraints. After the source and mask shape are determined, an actual source and mask can be produced and configured in accordance with the determined shapes and can be employed in a lithography process for the fabrication of integrated circuits and other similar devices and systems.

It should be noted that the controller or director 602 can be configured to direct a flow to derive an optimal lithographic source and mask solution that achieves a sufficiently acceptable attempt at obtaining the globally-optimal solution. The direction implemented by the controller or director 602 should account for the strengths and weaknesses of a number of stages that make up a source-mask optimization flow. These stages include: (a) initialization: (i) source initialization and (ii) frequency domain mask initialization; (b) a main SMO Loop: (iii) frequency domain mask optimization (Wavefront optimization, Quadratic, pseudo-global), (iv) source optimization (Linear, global), (v) frequency domain joint mask-source optimization (Cubic, local), (vi) wavefront engineering (Wavefront to polygon construction), (vii) partial domain mask optimization (Polygon optimization) and (viii) EMF (electromagnetic field) correction.

At each stage in the flow, the director 602 makes choices and determines the constraints, the objectives, and the underlying optimization formulation. Further, the director 602 should select constraint levels for each of the constraints. In addition, strategies should be established to enable the director 602 to judge and control these elements so as to best achieve the goals of a global optimization. Some constraints, objectives, or control variables include: minimum or maximum number of sequential optimizations; pupil fill specifications as well as given number of optimizations once a certain pupil fill is met; with regard to mask optimization, when to run or not to run the mask optimization and once run, the director obtains/determines various parameters, such as pupil fill, number of source and joint optimizations and objective requirements; minimum number of loops after mask optimization; contrast level; image log scope (ILS) level; mask error enhancement factor (MEEF) level of the polygon domain photomask; "efficiency" level of the frequency domain photomask; focus depth requirements; common process window; weakest process window; overlap of process window; various other process window definitions; average process variation (PV) band; and weakest PV band.

For each constraint, objective, or control variable decision, the director 602 can implement various strategies for updating settings. These strategies can be based on the current condition of the system, or can involve evaluating the history of conditions and parameters. This can include evaluating convergence performance. Update methodologies that can be applied by the director 602 can include tightening a constraint towards a requirement at the end of either the frequency or spatial domain optimization stages. Tightening approaches can follow a linear progression through the optimization loops, a logarithmic approach, or a completely dynamic approach based on a heuristic understanding of the problem.

Between optimization steps, the director 602 can apply additional techniques or heuristics to clean up the solution point or deal with failure of the optimization. Success of the optimization cannot, under certain circumstances, always be relied on; thus, the director 602 should not only be configured to make progress towards an optimal result, but must also be able to appropriately loosen constraints, or change the objective to allow optimization to continue if progress has stopped.

The director 602 can achieve all of these goals by maintaining optimization state information (history) and then performing processing before and after each optimization state to update the configuration based on the choices outlined above.

Method 700, the preferred embodiment, provides a more sophisticated flow. The method 700 can begin at step 702, in which the controller 602 performs pre-calculation. Here, data structures of the source and the mask can be built, and optical kernels of the imaging calculation system can be calculated. In the embodiment of method 700, the user need not provide an initial source or mask. The source and the mask can be determined based on an initial design target on a wafer.

The method can proceed to step 703, at which the system 600 implements a frequency domain optimization. For example, the optimization at step 703 can include a global solution search. The optimizations implemented at step 703 can be initiated with a set of parameters on which the optimizations are based and can be iterated with a modification of the set of parameters. The set of parameters can include one or more variable representations, one or more objectives, and/or problem constraints. Examples of problem constraints that can be included in the set are lithographical criterions, such as dimension error, contrast, MEEF, lithographic process window, each of which can be part of the initial set, can be subsequently refined, or can be added during iterations of the step 703 and subsequently refined.

At step 704, the controller 602 can initialize light source parameters. These light source parameters may specify the initially assumed directional distribution of the light pattern that illuminates the mask, with each such parameter representing the intensity that illuminates the mask from a particular direction, or narrow range of directions. Each such direction or narrow range of directions is referred to as a source pixel. Particular initial values for these parameters may be chosen by the controller 602 by first using a grating formula to calculate the diffractional deviations that a critical circuit pitch produces when present on the mask, and then choosing a directional tilt for the illumination which causes the diffractionally deviated light to fill the entrance pupil of the lithographic exposure system in a relatively balanced way. The directional illumination may further be initialized with a shape that is bilaterally symmetric; for example, the initial shape may be bilaterally symmetric about the x and y axes of the integrated circuit being fabricated.

Alternatively, an initial source may be chosen by the controller 602 by means of a heuristic linear program. To implement this linear program, a minimal set of joint eigenvectors is calculated for every source pixel. As explained in more detail herein below, a minimal set of joint eigenvectors for printing a desired pattern can be calculated for any source, and to carry out the source initialization, a minimal set of joint eigenvectors is first calculated for each source pixel. For the jth source pixel, this is done by calculating a minimal set of joint eigenvectors for a single-pixel source in which the jth pixel is set to 1 and all other pixels are set to 0. Next, for each source pixel, the controller 602 can determine the maximum intensity that any joint eigenvector of the pixel provides at each point in the printed pattern where bright intensity is desired, and also at each point where minimal intensity (darkness) is desired. We then let $M_u^j$ denote the maximum such intensity provided by any of the joint eigenvectors of the jth source pixel at the uth bright point, and $K_v^j$ denote the maximum such intensity at the with dark point. Then, an initial source s* may be chosen by the heuristic of solving the linear program $$s^* = \mathrm{argmin} \sum_{v \in D} I_v(s)$$

subject to:

$$I_u(s) > 1 \quad \forall u \in B$$
$$0 \geq s_j \geq 1 \quad \forall j \in J$$
$$\sum_{j \in J} s_j \geq S_{min}$$

where $$I_v(s) = \sum_{j \in J} s_j K_v^j$$
$$I_u(s) = \sum_{j \in J} s_j M_u^j$$

At step 706, the mask optimization module 604 can perform a mask optimization based on the set of parameters. For example, a mask optimization problem for a given source in a projection nanolithography imaging system may be written as a quadratic problem:

$$a^* = \mathrm{argmin} \sum_{v=1}^{v_{max}} a^T c_v A_0 a$$
$$a^T A_u a \geq 1, \quad 1 \leq u \leq u_{max}$$

where, $$A_0 = \sum_{v=1}^{v_{max}} c_v A_v,$$

where $a \in \mathfrak{R}$ n is a vector with the amplitude of all diffraction orders in the mask which are transferable through the partially coherent projection lithography imaging system. In particular, a* represents the amplitude of diffraction orders in the optimum mask. Ideally, a mask can be fabricated based on the information in a*.

The matrices $A_u$ and $A_v$ are specific to the source and provide the imaging system model for bright points u and dark points v at the image plane. The matrix $A_0$ is the average dark region matrix. Specifically, $a^T A_i a$ represents the intensity at point i due to a mask with diffraction orders given by a and an imaging system model (with a set source, etc) given by $A_i$. As a result, the contrast on the wafer is maximized by the mask optimization.

The problem can be transformed from the mask diffraction order space a to the joint eigenvector space α, where is related to a using, $$a = W\alpha$$

where, $$W = E_0 D_0^{-1/2} E_B$$

Here, $E_0$ represents the column-matrix with eigenvectors of a matrix $A_0$ and $D_0$ represents the diagonal matrix with eigenvalues of a matrix $A_0$. In general, given any arbitrary diagonalizable matrix $A_g$, the notation here uses $E_g$ to represent the matrix whose columns are the eigenvectors of $A_g$, and $D_g$ to represent the diagonal matrix of the eigenvalues of $A_g$.

Furthermore, $A_B$ is defined as follows:

$$A_B = D_0^{-\frac{1}{2}} E_0^T \left( \sum_{u=1}^{U_{max}} A_u \right) E_0 D_0^{-\frac{1}{2}}$$

Then, the following expression for the optimal mask is obtained:

$$a^* = W \operatorname{argmin} \sum_{v=1}^{v_{max}} \alpha^T \alpha$$

$$\alpha^T B_u \alpha \geq 1, \quad 1 \leq u \leq u_{max}$$

where, $$B_u = E_B^T D_0^{-\frac{1}{2}} E_0^T A_u E_0 D_0^{-\frac{1}{2}} E_B$$

In joint mean-intensity eigenvectors (JEV) computation, small positive values are added to black-region matrix. The method of adding small positive values as eigenelements in the computation does work, but it is more sensitive than necessary. The improved method is as follows:
1. Get eigenvectors Eu and eigenvalues Du from Au
2. Filter out small eigenvalues and associated eigenvectors. i.e., E'u and D'u
3. Get a intermediate basis $A_C = D_u'^{-0.5} E_u'^T A_0 E_u' D_u'^{-0.5}$
4. Get eigenvectors Ec from Ac
5. Get Joint Eigenvector $W = E_u' D_u'^{-0.5} E_C$ Step 5 here provides the full set of joint eigenvectors in matrix W, but the W matrix that is actually used in $$a^* = W \operatorname{argmin} \sum_{v=1}^{v_{max}} \alpha^T \alpha$$

is pruned to include only a minimal subset of joint eigenvectors that is sufficient to provide a high intensity of positive polarity at every point in the image where bright intensity is desired.

At step 708, the source optimization module 606 can perform a light source optimization based on the set of parameters. An optimal source shape corresponding to the optical mask which was optimized at the former mask optimization step is derived at the source optimization step. The source shape is optimized using a global method. For example, so-called lithographic sources are patterns of illumination directionality that are employed during lithographic exposures. In preferred embodiments of the invention, this source is specified by a list of intensities $\vec{s}$, with each element of $\vec{s}$ specifying in particular the intensity that illuminates the lithographic mask from a particular predefined narrow range of directions. In other embodiments, the predefined range of directions is more extended for some or all of the elements, and may take on a standard shape in direction cosine space, such as a circle, ring, or arc segment. The value assigned to any element of $\vec{s}$ may also specify the intensity of two or four narrow ranges of directions whose x and/or y direction components are oppositely signed, so that the two or four ranges illuminate the mask from mirrored directions. In general, each range or ranges of directions corresponding to any element of $\vec{s}$ will be referred to as a source pixel. Typically such a pixel represents a range of directions whose intensity throughout the range can be delivered to the mask at the specified level by hardware in the lithographic exposure tool.

In preferred embodiments, the source optimization step 708 is carried out as a linear program. Linear programming problems can be solved very robustly, allowing the flow to incorporate multiple new constraints (or newly tightened constraints) even when no feasible solution is known. Since only the source variables are optimized during source optimization, meaning that the mask variables are not brought to bear on the problem requirements, it is desirable that any such initial infeasibilities be modest in strength, so that the best known solution from the previous flow step is almost feasible in the newly tightened formulation. (Once the source optimization step provides a feasible solution, the mask variables can be brought to bear on the problem by carrying out a subsequent step of joint source and mask optimization.) However, even though the initial infeasibilities that are introduced during any single source optimization step should be kept small, one can make sure that the full sequence of optimization steps in the flow includes multiple steps of source optimization, making it possible to slowly but steadily tighten the problem requirements without excessively disrupting solution quality in any step.

In most cases the nominally ideal directional distribution of source intensity that would theoretically produce the best possible image will not in fact be practically acceptable—This is because such theoretically ideal solutions typically concentrate too high a portion of the illuminating flux into a very limited number of pixels, causing a local loading in parts of the exposure system that could give rise to optical damage, or that could cause larger thermal excursions than the imaging control actuators in the projection lens can accommodate. For this reason a maximum tolerable intensity level for each pixel is typically specified, with $p_j$ denoting the maximum for the jth pixel, and in addition a constraint, such as 10% on the minimum acceptable on-fraction of the available source pixels, is typically applied. These constraints prevent the illuminating flux from being overly concentrated into an overly small number of pixels. In many cases all $p_j$ are equal, but often the tolerable limit is less for pixels near the edge of the pupil, for example if these pixels are smaller in directional width than other pixels. For brevity we denote the list of maximum tolerable powers $p_j$ from all source pixels as $\vec{p}$. The $p_j$ values may be specified in physical energy units, but in many cases the absolute scale of the source solution can be assigned separately, and it often suffices to simply set the jth element of $\vec{p}$ equal to the (pre-blurred) area of the jth source pixel in direction cosine space.

In particular problems it may be desirable to constrain the intensity of source pixels such as the jth to a level that is somewhat lower than the tolerable upper limit $p_j$. Specifically, we define $S_{Max,j}$ to be the maximum allowed fraction of $p_j$ that the jth pixel is permitted to attain during a particular solution run; most often $S_{Max,j}$ will be set to 1, but it may optionally be set lower (or larger in experiments where brief overloading is allowed). Under this convention the source solutions $\vec{s}$ is defined on a 0-to-1 scale relative to the absolute pixel intensity limits $\vec{p}$.

Next, we determine the intensity that is produced at each sampled point in the image when the mask is illuminated by one source pixel at a time, with the on-pixel being set to its maximum intensity (without considering $S_{Max,j}$, i.e. the physical intensity of pixel j when switched on is $p_j$). The list of intensities that is produced at some sample point by the different on-pixels is written $\vec{I}$. If edge log-slope is to be used in the constraints of the problem, or in the objective, a list of edge slopes $\vec{I'}$ is computed at each edge sample point, corresponding to a list of the intensity slopes produced at the sample point when each source pixel is set to maximum intensity, one at a time. The positive sign for image slope is chosen as that of an image which has the desired polarity at the sample point in question.

Although physical image intensity is linear in source intensity, preferred lithographic metrics like Image Log-Slope, Common Process Window, and Worst-case Process Window (the latter also being referred to as Weakest Window) all involve relative intensities or ratios of intensities, which would introduce a nonlinearity into the problem. Such nonlinearities would normally rule out the use of linear programming methods to carry out the optimization, but in accordance with the embodiments described herein one can employ these methods with their attendant benefit of robustness by first redefining the source variables to have a relative or homogeneous form that can float freely in overall magnitude, and then taking advantage of that freedom to set the mean or anchoring intensity at the print contour to an artificial value of 1. When the intensity is 1 the log-slope and linear slope metrics become equal, as do the linear exposure-defocus latitude and the fractional process window metrics. Fractional process window (also known as percentage process window) and log-slope are preferred lithographic metrics, but the linear forms of these metric can be optimized using robust linear programming methods. By setting the anchoring intensity to the artificial value of 1 we achieve both advantages together. It should be noted that even though the anchor constraint only unitizes the print intensity of the mean or anchoring feature, the intensity of all other print locations will necessarily have nearly the same value in an acceptable solution, making the linear objective adequately close to the more ideal fractional objectives. Once the optimal source shape is determined, the artificial anchoring to unity can be removed by uniformly rescaling the solution, as will be described.

Although the overall float in the redefined source variables (which are denoted) $\vec{\sigma}$) can be removed by a post-optimization rescaling, the intermediate source solution in the $\vec{\sigma}$ variables should obey (at least in a homogeneous or relative way, i.e. in a nascent or preparatory form) the individual pixel energy limits $p_j$ and $S_{Max,j}$. This can be done by reformulating the pixel limits as homogeneous constraints, as will be described.

To accommodate depth-targeted dose variations (e.g. for 3D lithography) we also introduce a parenthesized superscript notation which designates, for example, different planes or different averaged-depth-bands within the film stack; and without loss of generality we apply our anchoring constraint to depth-band 0. In many embodiments we use the mean intensity over all features as an anchor. To allow for sensitivity differences within the imaging stack, as in a dual damascene application, we introduce different open-frame or dose-to-clear levels $f^{(1)} \ldots f^{(n)}$ that would apply to the different depth bands in isolation. Bright and dark levels for the bands are defined as e.g. $f^{(1)}R_{Dark}^{(1)}$. (The $R_{Dark}^{(1)}$ contrast limits have a relatively weak depth dependence once the $f^{(n)}$ are factored out.)

We also make explicit the possibility of multiple exposures, using $g_e$ to designate a dose adjustment that is made externally to the optimization during the eth exposure. The idea here is that a standard fixed normalization can be retained in the $\vec{I}_e$ coefficients, while $g_e$ can then be varied, for example in an outer loop.

In different embodiments the objective may be chosen variously as the worst-case process window, the edge log-slope, or the common process window (which may be defined for the source optimization step as the area of the exposure-defocus process window between the focal planes k=1 and k=$K_{Max}$). When one of these quantities is chosen as the objective it is often desirable to constrain one or more of the others; for example to prohibit excessive degradation in a metric that was itself used as the objective in an earlier iteration.

The common process window objective refers to maximizing the common exposure-defocus process window within which all features successfully meet their dimensional tolerances. The worst-case process window objective refers to maximization of the worst-case exposure-defocus window arising amongst all the various feature edges if considered independently. The edge slope objective refers to maximization of the smallest (i.e. worst-case) image log-slope amongst all the features, thereby reducing sensitivity to exposure fluctuations, while also taking into account any variations in intensity that may arise through focus, thereby reducing sensitivity to focus fluctuations.

To define the process window metrics one determines or specifies in advance the allowed limits of feature position under conditions of maximum overexposure and minimum underexposure. At the rth sampled location along the nominal feature edge the maximum allowable "inward" offset into the bright region under conditions of worst-tolerable underexposure is designated $CD_{-,r}$, while the maximum allowable offset in the opposite direction (i.e. into the dark region) under conditions of worst-tolerable overexposure is designated $CD_{+,r}$. The list of intensities produced at the former set of sample points from each one-at-a-time on-pixel in the source is written $\vec{I}_{r[n]}^{(n)}(CD_-, k\Delta z)$, with n designating a particular depth-band within the resist, and with $k\Delta z$ designating the kth focal plane. $\vec{I}_{r[n]}^{(n)}(CD_+, k\Delta z)$ denotes the corresponding list for the overexpose sample points.

The edge slope metric typically does not use overexpose and underexpose sample points, but instead multiplies the slope at each edge by an edge placement error (EPE) tolerance L in order to obtain an allowed dose margin that should also accommodate intensity changes through focus. L is essentially the separation between $CD_+$ and $CD_-$. The edge slope objective, like weakest window, is less tied to a finalized Optical Proximity Correction (OPC) in the mask than is common window. The edge slope approximation avoids the increase in the number of auxiliary variables or through-focus constraints that is often entailed by worst-case window. In the formulation below the edge-slope W is calculated as a single quantity throughout the Depth of Focus (abbreviated DOF, which is set by $K_{Max}$), and the DOF should then be chosen somewhat conservatively. Alternatively, the edge-slope objective can be integrated over a set of focal planes, as common and worst-case window are.

Written out in more detail, source optimization formulations may encompass the following:

$$\underset{w.r.t.\,\vec{\sigma},\ +aux.\ vars.}{\text{Maximize}}\ \Psi(aux.\ vars.; \vec{\sigma}),$$

where some possible objective choices are $$\Psi_{Common}(\vec{w}', \vec{w}; \vec{\sigma}) = \sum_{k=1}^{K_{Max}} (w'_k - w_k),\ \text{or}$$

$$\Psi_{Worst\text{-}case}(\vec{\omega}''; \vec{\sigma}) = \sum_{k=1}^{K_{Max}} \omega''_k,\ \text{or}\ \Psi_{Slope}(W; \vec{\sigma}) = W$$

subject to:

a) $0 \leq \,_{j,e}S_{Min} \leq S_{Max,j,e}\vec{\sigma} \cdot \vec{p}_e \qquad \forall_{j=1}^{J_{Max}} \forall_{e=1}^{e_{Max}}$ $b_1)\ \sum_{e=1}^{e_{Max}} g_e\vec{\sigma} \cdot \vec{I}_0(0,0) = 1$ $c_1)\ f^{(0)} \sum_{e=1}^{e_{Max}} g_e\vec{\sigma} \cdot \vec{I}^{(n)}_{u[n]}(0,0) \geq f^{(n)} R^{(n)}_{Bright} \qquad \forall_{n=1}^{n_{Max}} \forall_{u=1}^{u_{Max}[n]}$ $c_2)\ f^{(0)} \sum_{e=1}^{e_{Max}} g_e\vec{\sigma} \cdot \vec{I}^{(n)}_{v[n]}(0,0) \leq f^{(n)} R^{(n)}_{Dark} \qquad \forall_{n=1}^{n_{Max}} \forall_{v=1}^{v_{Max}[n]}$ with additional constraints chosen from:

[1]

$b_2)\ f^{(0)} \sum_{e=1}^{e_{Max}} g_e\vec{\sigma} \cdot \vec{I}^{(n)}_{r[n]}(0,0) = f^{(n)} \qquad \forall_{n=1}^{n_{Max}} \forall_{r=1}^{r_{Max,OPC}[n]}$ $d)\ w'_k - w_k \geq t_k \qquad \forall_{k=1}^{K_{Max}}$ $d')\ \omega'^{(n)}_{k,r[n]} - \omega^{(n)}_{k \cdot r[n]} \geq \Omega_k \qquad \forall_{k=1}^{K_{Max}} \forall_{n=1}^{n_{Max}} \forall_{r=1}^{r_{Max}[n]}$ $d'')\ w \geq T$ $e_1)\ f^{(n)} w_k f^{(0)} \sum_{e=1}^{e_{Max}} g_e\vec{\sigma} \cdot \vec{I}^{(n)}_{r[n]}(CD_+, k\Delta z) \qquad \forall_{k=0}^{K_{Max}} \forall_{n=1}^{n_{Max}} \forall_{r=1}^{r_{Max}[n]}$ $e_2)\ f^{(n)} w'_k \leq f^{(0)} \sum_{e=1}^{e_{Max}} g_e\vec{\sigma} \cdot \vec{I}^{(n)}_{r[n]}(CD_-, k\Delta z) \qquad \forall_{k=0}^{K_{Max}} \forall_{n=1}^{n_{Max}} \forall_{r=1}^{r_{Max}[n]}$ $e'_1)\ f^{(n)} \omega^{(n)}_{k,r[n]} \geq f^{(0)} \sum_{e=1}^{e_{Max}} g_e\vec{\sigma} \cdot \vec{I}^{(n)}_{r[n]}(CD_+, k\Delta z) \qquad \forall_{k=0}^{K_{Max}} \forall_{n=1}^{n_{Max}} \forall_{r=1}^{r_{Max}[n]}$ $e'_2)\ f^{(n)} \omega'^{(n)}_{k,r[n]} \leq f^{(0)} \sum_{e=1}^{e_{Max}} g_e\vec{\sigma} \cdot \vec{I}^{(n)}_{r[n]}(CD_-, k\Delta z) \qquad \forall_{k=0}^{K_{Max}} \forall_{n=1}^{n_{Max}} \forall_{r=1}^{r_{Max}[n]}$ $e'_3)\ \omega''_k \leq \omega'^{(n)}_{k,r[n]} - \omega^{(n)}_{k,r[n]} \qquad \forall_{k=0}^{K_{Max}} \forall_{n=1}^{n_{Max}} \forall_{r=1}^{r_{Max}[n]}$ $e''_1)\ f^{(n)} W \leq \sum_{e=1}^{e_{Max}} g_e f^{(0)}\vec{\sigma}_e \cdot \begin{bmatrix} L^{(n)}_{r[n]} \vec{I}^{(n)}_{r[n]}(0, k\Delta z) + \\ \vec{I}^{(n)}_{r[n]}(0, 0) - \vec{I}^{(n)}_{r[n]}(0, k\Delta z) \end{bmatrix} \qquad \forall_{k=0}^{K_{Max}} \forall_{n=1}^{n_{Max}} \forall_{r=1}^{r_{Max}[n]}$ $e''_2)\ f^{(n)} W \leq \sum_{e=1}^{e_{Max}} g_e f^{(0)}\vec{\sigma}_e \cdot \begin{bmatrix} L^{(n)}_{r[n]} \vec{I}^{(n)}_{r[n]}(0, k\Delta z) + \\ \vec{I}^{(n)}_{r[n]}(0, k\Delta z) - \vec{I}^{(n)}_{r[n]}(0, 0) \end{bmatrix} \qquad \forall_{k=0}^{K_{Max}} \forall_{n=1}^{n_{Max}} \forall_{r=1}^{r_{Max}[n]}$ $f_1)\ w_k \geq w_{k-1} \qquad \forall_{k=1}^{K_{Max}}$ $f_2)\ w'_k \leq w'_{k-1} \qquad \forall_{k=1}^{K_{Max}}$ $f'_1)\ \omega^{(n)}_{k,r[n]} \geq \omega^{(n)}_{k-1,r[n]} \qquad \forall_{k=0}^{K_{Max}} \forall_{n=1}^{n_{Max}} \forall_{r=1}^{r_{Max}[n]},\ \text{or}$ $f'_2)\ \omega'^{(n)}_{k,r[n]} \leq \omega'^{(n)}_{k-1,r[n]} \qquad \forall_{k=0}^{K_{Max}} \forall_{n=1}^{n_{Max}} \forall_{r=1}^{r_{Max}[n]}$ Once eq.1 is solved, the intensities of the true source variables $\vec{s}$ are obtained from:

$$s_j = \alpha_j \underset{j}{\text{Min}}\left[S_{Max,j}/\alpha_j\right]. \quad [2]$$

The three objective examples shown in the eq.1 formulation are, respectively, common process window, worst-case process window (also known as weakest window), and image log-slope. The auxiliary variables w, ω, and W represent these various metrics, and are driven to the correspondingly appropriate values by the constraints e, as will be discussed below.

Constraint a enforces the restrictions of maximum allowed pixel intensity and minimum required pupil fill, but it does so in an indirect homogeneous fashion, as is appropriate for the $\vec{\alpha}$ variables. Constraint a is essentially normalized (but with cross-multiplication) in terms of the $\vec{\alpha}_e$-dependent total power $\vec{\alpha}_e \cdot \vec{p}_e$ (for the eth exposure), making the constraint homogeneous, and allowing later rescaling to the correct limits for the $\vec{s}$ variables after eq.2 is applied, as will be discussed. Constraint a is already sufficient to provide a source with the optimal relative shape, i.e. it causes the pixel intensity limits to be satisfied in nascent form, and eq.2 is only employed in order to give this intermediate solution a valid overall scale.

Constraint $b_1$ is an anchoring constraint that forces the linear metrics used by the linear programming solver to match the fractional (i.e. percentage or logarithmic-derivative) metrics that are usually preferred in lithography. The unity right-hand side of this constraint cannot generally be satisfied by a physical solution, but the intermediate solution to eq.1 provided by the linear programming solver is later made physical by application of eq.2. Other features can optionally be anchored to the same precise value as the constraint a anchoring feature by using optional constraints of the $b_2$ form (which allow for any differences in sensitivity at different resist depths). If the $b_2$ constraints are omitted these other features will typically remain approximately anchored, since the optimizer can be expected to drive these features close to the nominal print position.

Constraints c are contrast constraints, ensuring that the optimized image has proper polarity at all points, and that artifacts of the wrong polarity are nowhere formed.

Constraints d may optionally be applied to any or all of the window and log-slope metrics (most particularly those which are not used as objective) in order to ensure a minimally acceptable process. When objectives are changed during the overall flow, constraints of type d can ensure that previously accomplished gains in solution quality are not undone when optimization with a new objective is undertaken.

As noted, constraints e ensure that the w, ω, and W auxiliary variables take on values which match the corresponding window and edge-slope metrics. Such a conformance is enforced as the optimizer drives these auxiliary variables to optimal values. It should be noted that auxiliary variables which are not included in the objective will not necessarily match their corresponding lithographic metric even when the latter is explicitly constrained (via constraints of the e form), unless the constraints in question are binding at the solution. However, linear program constraints which are not binding do not influence the solution obtained.

Constraints f are dose commonality constraints which ensure that any exposure dose that is deemed to be within the acceptable process window for a particular defocused image plane will also be valid in-focus, and indeed throughout the focal span between the defocused plane and the plane of best focus.

The eq.1 constraint and objective choices define a linear program that can be solved using standard methods. Once the solution to eq.1 has provided optimal values for the intermediate $\vec{\alpha}$ variables, eq.2 can then be used to obtain the actual $\vec{s}$ optimum source. Eq.1 is sufficient to provide the intermediate $\vec{\alpha}$ solution with the correct overall shape and percentage pupil fill, and eq.2 then adjusts the absolute intensity scale of this solution to ensure that no pixel exceeds its maximum allowed intensity.

Referring again to FIG. 7, at step 710, the joint source-mask optimization module 608 can perform joint source-mask optimization. At the joint source-mask optimization, the source and frequency domain mask variables are all optimized together using a local optimizer.

As indicated above, the flow of the method 700 includes repeated optimizations, where, from step 710, the method can proceed to step 706 or step 708 and can be repeated. Each iteration of steps 706-710 or steps 708-710 can constitute a stage in the optimization. After each stage or iteration, the controller 602 can alter constraints or variables in the set of parameters on which the iterations are based by, for example, incorporating new constraints and/or variables, and/or by tightening constraints already in the set. The controller 602 controls the flow of the method by acting as a director. The controller 602 can store and reference a variety of information relating to the current state of the optimization control. For example, the controller 602 can control the optimization flow at steps 706-710 by monitoring the objective value, the feasibility of constraint conditions and the number of iterations conducted. The controller 602 also ensures that the disruptions between stages are kept in the regime of modest perturbations and do not exceed the optimization module's ability to adapt to the changes in the set of parameters.

Figure 8:
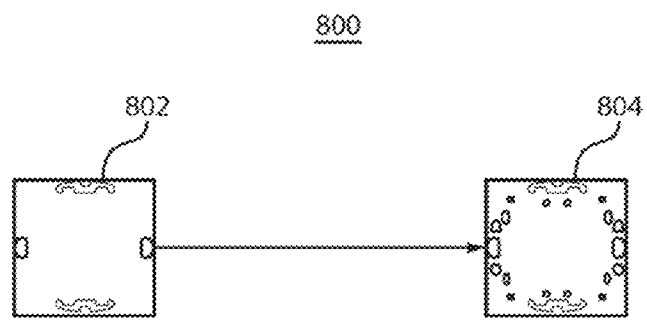
FIG. 8 is a diagram illustrating an example of tightening or increasing a pupil fill constraint on a light source during an optimization process in accordance with an exemplary embodiment of the present principles.

For example, at least one problem constraint can specify a constraint on pupil fill that can be changed by the controller 602 from one optimization stage to the next. Further, a limit can be placed on a prescribed increase or change of the constraint from the preceding stage to a next stage to minimize the disruptive departure of the formulation in the next stage. FIG. 8 illustrates an example of tightening or increasing a pupil fill constraint on a light source gradually through each successive iteration of the source optimization at step 708. For example, in one iteration or initial implementation of step 708, the pupil fill factor constraint can be set to 0.05 as illustrated in block 802 by the controller 602 and gradually increased by the controller 602 in subsequent iterations of step 708 towards and to a final pupil fill constraint of 0.1, which is the desired lithographical criterion in one example, as illustrated in block 804. The criteria would otherwise be difficult to meet using trial and error steps that simply employ the final pupil fill constraint.

Figure 9:
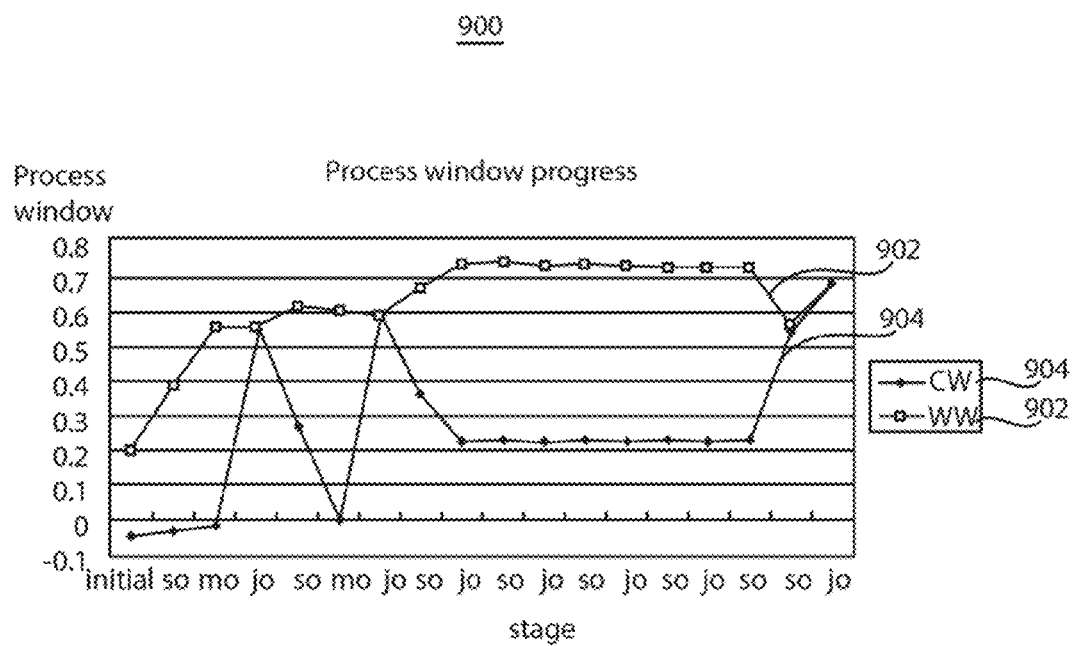
FIG. 9 is a graph illustrating states of the process window determined at various stages of an optimization process in accordance with an embodiment of the present principles.

The changes to the one or more variable representations, one or more objectives, and/or problem constraints implemented in iterations of steps 706-710 can result in an objective evolution from a weakest window (WW) to a maximized common process window (CW). For example, a main objective of the source-mask optimization is to maximize the common process window. However, it is difficult to maximize the common process window in the initial stage of optimization because a user cannot provide a good starting point. In contrast, it is relatively easy to maximize the weakest window even in the initial stage of the optimization. Thus, the changes to the parameter set implement an objective evolution which starts from a weakest window and evolves toward the common process window. The common process window objective is only used in the last source optimization (SO) and joint optimization (JO) and the weakest window objective is used in earlier stages. FIG. 9 illustrates that usage of the weakest window in the initial stage can result in a good common process window at the last stage. Plot 902 denotes the achievable process window in accordance with the method 700 through gradual changing of the objective towards the CW objective, while plot 904 denotes a joint optimization that is implemented with the CW objective only.

Figure 11:
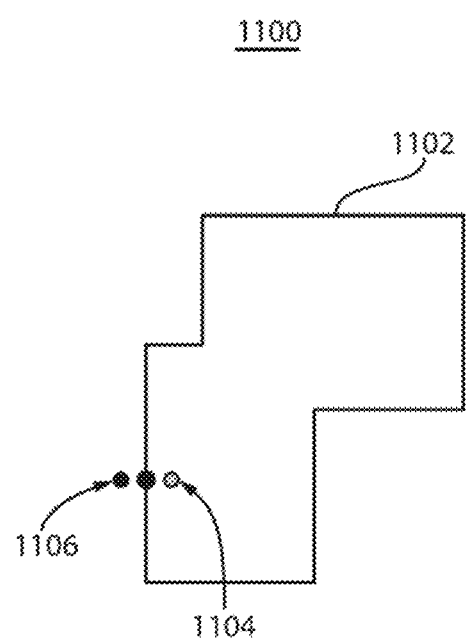
FIG. 11 is a high-level block diagram of a mask polygon.

The joint optimization can performed by solving the following:

$$\max \sum_f w_{i,f}^- - w_{i,f}^+$$

where f is a focus plane, $w_i^-$ is an edge under intensity and $w_i^+$ is an edge over intensity. For example, with reference to FIG. 11, a high-level block diagram of a mask polygon 1100 is illustrated. The mask polygon includes edges 1102, and elements 1104 and 1106 respectively depict examples of an edge under intensity and an edge over intensity. In particular, an edge under intensity represents an intensity inside a polygon edge, while an edge over intensity represents an intensity outside a polygon edge. CW takes into account the threshold energy of resist film. On the other hand, WW does not take into account a threshold energy. Therefore, WW is equivalent to an intensity slope at a polygon edge.

In the preferred embodiment, the frequency domain optimization 703 can be terminated when the number of loop iterations exceeds a maximum number of loop iterations. Even if the number of loop iterations executed does not reach the maximum number, the frequency domain optimization 703 can be terminated if all the following conditions are fulfilled: the maximum pupil fill is met; a minimum number of loop iterations is exceeded; and an acceptable overlap window at a given DOF (Depth Of Focus) is met.

After the frequency domain optimization is completed, the method 700 can proceed to step 711, at which spatial domain optimization for the light source shape and mask shape is performed. In particular, the method can proceed to step 712, at which the spatial optimization module 610 can implement wavefront engineering. At this point, the optical mask pattern is ideally represented in frequency domain or continuous values. Wavefront engineering is employed to determine a set of actual manufacturable mask patterns that can produce the optimal imaging waves when the mask patterns are illuminated by the optimal illumination beams. Thus, an optimal set of frequency domain masks (identical to optical imaging waves) that is an output of step 703 is converted to manufacturable polygons with a specific transmission coefficient.

At step 714, the spatial optimization module 610 can iteratively perform joint source-mask spatial optimization. Similar to the iterations in the frequency domain, here, spatial optimization module 610 can also change variable representations, one or more objectives, and/or problem constraints. For example, as noted above, the optimization module 610 can at step 712 change the set of parameters so that the variable representation for the mask shape is a polygon-domain representation. Here, through a plurality of iterations or stages of step 714, the polygon representation is evolved from one optimization stage of step 714 to the next. A Manufacturability Rule Check (MRC) model is used in the initial stage of polygon optimization and the representation is subsequently evolved by removing suitable fragments that the module 610 deems to have low optical impact. In the first stage of the wavefront engineering, the frequency domain masks are converted to mask polygons with a specific transmission coefficient. In the second stage of the wavefront engineering, the shape of the mask polygon is optimized for minimizing manufacturability penalties together with lithographic constraints, such as MEEF and contrast, by using a constrained non-linear optimizer. The manufacturability penalty is derived from the relative position of an intra- or inter-polygon edge pair. A primary purpose of spatial domain joint optimization (SDJO) at step 714 is to maximize the common process window while maintaining a mask manufacturability penalty which is optimized in the wavefront engineering step 712. However, as indicated above, another purpose is to reduce the number of edges of mask polygons through the SDJO in order to avoid long mask manufacturing time. Thus, for this purpose, through each iteration of step 714, the optimization module 610 deletes one or more fragments from the variable representation in a way that minimizes disruption in solution quality when the next round of optimization at step 714 is launched. In accordance with one example, the spatial optimization module 610 can evaluate the edges of the polygon to determine whether any edge is shorter than a certain threshold value. If so, then the spatial optimization module 610 removes the edges that are shorter than the threshold value at step 714.

It should be noted that the set of parameters employed in the frequency domain optimization 703 can include mask blank constraints. Mask blank constraints take the following form:

$$\begin{cases} C_{dp} \cdot a \geq \dfrac{t_{dp}}{L} \cdot \sum_{r=1}^{L} (C_r \cdot a) & \forall\, dp \\[6pt] C_{di} \cdot a \geq \dfrac{t_{di}}{L} \cdot \sum_{r=1}^{L} (C_r \cdot a) & \forall\, di \\[6pt] C_r \cdot a \geq \dfrac{t_l}{L} \cdot \sum_{r=1}^{L} (C_r \cdot a) & \forall\, r \\[6pt] C_r \cdot a \geq 0 & \forall\, r \end{cases}$$

where a is a diffraction-order mask variable (vector) in the pupil domain, $C_{dp}$ represents the inverse Fourier transform (iFT) coefficient vector at a dark premier point; $C_{di}$ represents the iFT coefficient vector at a dark interior point; $C_r$ denotes the iFT coefficient vector of the set of reference bright points, and $C_r \cdot a$ denotes the transmittance of the mask at the reference bright points, L is the total number of the reference bright points, and negative excursions at a given premier point, a dark premier point and a dark interior point are provided by $t_l$, $t_{dp}$ and $t_{di}$, respectively. The mask blank constraints can be used to minimize formulation disruptions in the spatial optimizations. For example, mask blank constraints minimize disruption during the flow step 712 where a frequency domain solution is converted to a set of polygon apertures in a mask film of prescribed type, since the mask blank constraints ensure that the optical amplitude along the mask in the frequency-domain will correspond to a band-limited amplitude that is bounded by the allowed transmissions of the mask blank, with additional Gibbs-like negative amplitude excursions allowed near feature edges to compensate for the loss of edge definition that is entailed by band-limiting.

As indicated above, masks are modeled by using a thin mask approximation (TMA). In the EMF (electromagnetic field) correction step 716, the spatial optimization module 610 compensates the optical image formed on the wafer by using a Maxwell solver. For example, the spatial optimization module 610 can apply an EMF correction algorithm that compensates for the real component of EMF effects (amplitude losses) through shape manipulation. Imaginary part compensation can be implemented through topography manipulation.

After the source and mask shape are determined, an actual source and mask can be produced and configured in accordance with the determined shapes and can be employed in a lithography process for the fabrication of integrated circuits and other similar devices and systems.

It can be shown that the method 700 can provide a substantial gain over the methods 400 and 500 in meeting the common process window objective for a 22 nm node. However, there may be cases in which the optimization flow 703 described above with respect to the frequency domain provides inferior results compared to the simple multiple source-mask joint optimization methods 400 and 500 of FIGS. 4 and 5. Thus, in accordance with one embodiment, the optimization flow can be switched so that the system 600 uses the results of method 400 and/or method 500 when the controller detects that the method 700 performs poorly. For example, the method 700 can include a decision step 712, where the controller 602 determines whether a flow or method change should be implemented. If so, then the system 600 stores the results of the joint optimization of method 400 or the method 500 and then continues to the spatial optimization at step 711 using those results. Otherwise, the system 600 continues implementing the method 700 as described above. Here, the controller 602 can utilize the following criteria at the decision step 712. It should be noted that step 706 is also referred to as a mask initialization (MI). If the WW of the first MI iteration and the WW of the third iteration of the SO performed at step 708 do not exceed the WW of a first iteration of joint optimization at step 404 or step $504_1$, then the controller 602 can stop the method 700 and use the results of the joint optimization of method 400 or 500.

For example, if the method 400 is employed, the controller 602 can direct the optimization module 608 to perform steps 402 and 404 and can compare the joint optimization results of step 404 to the MI/SO results discussed above at step 712. If the controller 602 determines that a flow switch should be applied, then the joint optimization results of step 404 can be used in step 711. Otherwise, method 700 is continued at step 703. Alternatively, if the method 500 is employed, the controller 602 can direct the optimization module 608 to perform steps 502 and $504_1$ and can compare the joint optimization results of step $504_1$ to the MI/SO results discussed above. If the controller 602 determines that a flow switch should be applied, then the controller 602 directs the optimization module 608 to perform the plurality of the JO steps of the method 500 and to proceed to step $504_n$. Thereafter, the joint optimization results of step $504_n$ can be used in step 711. Otherwise, method 700 is continued at step 703. Table 1 below illustrates an example of pseudo code that implements the flow switch.

TABLE 1

Run JO and store the results and WW_jo of method 500;
delta = 0.04*WW_jo;
Run the first half 703 of the full flow method 700;
if ( ( WW_full(MI-1) < WW_jo)
    & (WW_full(SO-3) < WW_jo + delta)

TABLE 1-continued

){
    Restore the JO results and run the subsequent JO;
} else {
    Run the subsequent stage of the full flow;
}
Finished.

Figure 10:
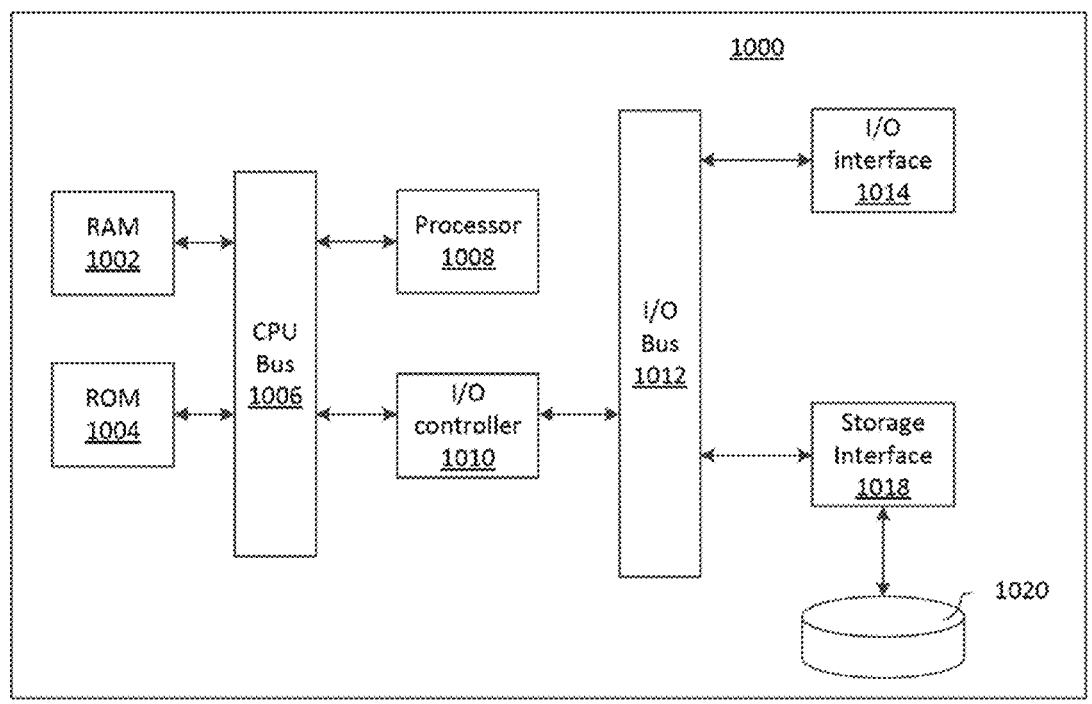
FIG. 10 is a high-level block diagram of a computing system by which method and system embodiments of the present principles can be implemented.

Referring now to FIG. 10, an exemplary computing system 1000 in which system embodiments of the present principles described above can be implemented, and by which method embodiments of the present principles described above can be implemented, is illustrated. The computing system 1000 includes a hardware processor 1008 that can access random access memory 1002 and read only memory 1004 through a central processing unit bus 1006. In addition, the processor 1008 can also access a storage medium 1020 through an input/output controller 1010, an input/output bus 1012 and a storage interface 1018, as illustrated in FIG. 10. The system 1000 can also include an input/output interface 1014, which can be coupled to a display device, keyboard, mouse, touch screen, external drives or storage mediums, etc., for the input and output of data to and from the system 1000. For example, the initial source shape and the initial mask shape described above can be input into the system 1000 through the interface 1014 and the determined source and mask shapes can be output from the system 1000 through the interface 1014. In accordance with one exemplary embodiment, the processor 1008 can access software instructions stored in the storage medium 1020 and can access memories 1002 and 1004 to run the software and thereby implement methods 500 and 700 described above. In addition, the processor 1008 can implement each of the system elements described above, such as the controller 602, the mask optimization module 604, the source optimization module 606, the joint source-mask optimization module 608 and the spatial optimization module 610. Alternatively, each of these system elements can be implemented via a plurality of processors 1008.

Having described preferred embodiments for source-mask optimization for a lithography process (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for optimizing a source shape and a mask shape for a lithography process comprising:
    performing a mask optimization for the lithography process in accordance with a set of parameter including at least one variable representation, at least one objective and problem constraints;
    performing a light source optimization for the lithography process in accordance with the set of parameters; performing a joint light source-mask optimization in accordance with the set of parameters; and
    iterating, by a hardware processor, at least one of said mask optimization or said light source optimization by changing at least one of the variable representation, the objective or-the problem constraints to maximize a common process window for the lithography process, wherein the iterating evolves the at least one objective, wherein the iterating is repeated such that at least one initial stage of iteration maximizes a weakest window and wherein the common process window is maximized in a last stage of iteration.

2. The method of claim 1, wherein the changing comprises adding or restricting the problem constraints.

3. The method of claim 2, wherein at least one of the problem constraints includes a pupil fill constraint.

4. The method of claim 1, wherein the performing the mask optimization, the performing the light source optimization, the performing the joint light source-mask optimization, and the iterating are implemented in a frequency domain.

5. The method of claim 4, further comprising:
performing a spatial optimization.

6. The method of claim 5, wherein the performing the optimization further comprises changing the variable representation to a polygon-domain representation.

7. The method of claim 6, wherein the method further comprises:
iterating a spatial joint source-mask optimization to remove fragments of the polygon-domain representation deemed to have low optical effect.

8. The method of claim 7, wherein the iterating of the spatial optimization comprises an initial stage that utilizes a manufacturability rule check.

9. The method of claim 5, wherein the problem constraints comprise mask blank constraints assessed during said spatial optimization in said frequency domain.

10. A system for optimizing a source shape and a mask shape for a lithography process comprising:
a mask optimization module configured to perform a mask optimization for the lithography process in accordance with a set of parameters including at least one variable representation, at least one objective and problem constraints;
a source optimization module configured to perform a light source optimization for the lithography process in accordance with the set of parameters, wherein iterations of at least one of said mask optimization or said light source optimization maximizes a weakest window during initial stages of the iterations and wherein the common process window is maximized in a last stage of the iterations;
a joint source-mask optimization module configured to perform a joint light source-mask optimization in accordance with the set of parameters; and
a controller implemented by a hardware processor and configured to direct at least one of the mask optimization module or the source optimization module to iterate at least one of said mask optimization or said light source optimization by changing at least one of the variable representation, the objective or the problem constraints to maximize a common process window for the lithography process.

11. The method of claim 10, wherein the changing comprises adding or restricting the problem constraints.

12. The method of claim 11, wherein at least one of the problem constraints includes a pupil fill constraint.

13. The method of claim 10, further comprising:
a spatial optimization module configured to perform a spatial optimization.

14. The method of claim 13, wherein the spatial optimization comprises changing the variable representation to a polygon-domain representation.

15. The method of claim 14, the spatial optimization module is further configured to iterate a spatial joint source-mask optimization to remove fragments of the polygon-domain representation deemed to have low optical effect.

16. The method of claim 14, the spatial optimization module is further configured to utilize a manufacturability rule check in an initial stage of iteration.

\* \* \* \* \*